United States Patent [19]

Akasaki et al.

[11] Patent Number: 4,689,658

[45] Date of Patent: Aug. 25, 1987

[54] MODULAR SEMICONDUCTOR DEVICE

[75] Inventors: Hidehiko Akasaki, Aizuwakamatsu; Kiyoshi Miyasaka, Yokohama, both of Japan

[73] Assignee: Fujitsu Limited, Kawasaki, Japan

[21] Appl. No.: 536,324

[22] Filed: Sep. 27, 1983

[30] Foreign Application Priority Data

Sep. 30, 1982 [JP] Japan ................................ 57-171260

[51] Int. Cl.$^4$ ............................................. H01L 39/02
[52] U.S. Cl. ......................................... 357/80; 357/74; 361/386; 365/226
[58] Field of Search ............................ 357/75, 80, 74; 361/386–389, 393, 395, 413, 415, 390, 392, 414, 416; 365/63, 72, 189, 226, 227, 230

[56] References Cited

U.S. PATENT DOCUMENTS

| | | | |
|---|---|---|---|
| 3,697,831 | 10/1972 | Anderson et al. | 357/75 |
| 3,790,859 | 2/1974 | Schraeder et al. | 357/80 |
| 3,815,106 | 6/1974 | Wiedmann | 365/72 |
| 4,481,609 | 11/1984 | Higuchi et al. | 365/72 |

FOREIGN PATENT DOCUMENTS 29133  3/1977  Japan ..................... 365/72

OTHER PUBLICATIONS

Rogers, IBM Tech. Disc. Bull., vol. 13, No. 2, Jul. 1970, "Chip Joining Both Sides of Substrates Simultaneously," p. 396, (357/75).

Crawford et al., IBM Tech. Disc. Bull., vol. 20, No. 11B, Apr. 1978, "High Density Multilayer Ceramic Module," pp. 4471–4773, (357/80).

Audi, IBM Tech. Discl. Bull., vol. 19, No. 2, Jul. 1976, "Cooling and Minimizing Temperature Gradient in Stacked Modules," p. 414, (357/75).

Gaennsslen, IBM Tech. Discl. Bull., vol. 12, No. 10, Mar. 1970, "Multichip Packaging," p. 1579, (357/75).

Archey et al., IBM Tech. Discl. Bull., vol. 24, No. 3, Aug. 1981, "Microsystem Package for Chips," p. 1657, (365/72).

Primary Examiner—John Lee
Assistant Examiner—Frank Gonzalez
Attorney, Agent, or Firm—Staas & Halsey

[57] ABSTRACT

A modular semiconductor device for use as a memory or used in logic circuit electronic equipment, includes a plurality of IC chips mounted on one or both sides of a printed circuit substrate. The IC chips are grouped into at least two groups which are selectively operated. The IC chips in one group are arranged alternately with the IC chips in the order group to provide a substantially uniform temperature distribution, over the substrate, of heat build-up in the substrate due to activation of the IC chips.

5 Claims, 8 Drawing Figures

MODULAR SEMICONDUCTOR DEVICE

BACKGROUND OF THE INVENTION (1) Field of the Invention

This invention relates to a modular semiconductor device comprising a plurality of integrated circuit (IC) chips mounted on a printed circuit substrate, and, more particularly, to a modular semiconductor device comprising a plurality of leadless chip carriers (LCC's) mounted on a printed circuit substrate with a high packaging density.

(2) Description of the Prior Art

Considerable advances have recently been made in increasing the integration degree of electronic components, as seen, for example, by large-scale integrated devices (LSI's). At the same time, there have been advances in increasing packaging density of electronic components.

One means to increase the packaging density is the use of LCC's. LCC's enable IC chips to be mounted thereon without conventional outer leads. As the standardized 100-mil spacing of leads is therefore no longer necessary, a ½ to ⅔ size reduction is possible over dual-in-line packages (DIP's), flat packages (FPP's) and other conventional IC packages.

In modular semiconductor devices comprising a plurality of LCC's mounted on printed circuit substrates, however, the high density packaging has created the problem of heat buildup. In the case where the LCC's of a modular semiconductor device are split into groups for simultaneous group selection and operation, no specific consideration has been given to the relative positioning of the LCC's. Thus, in the prior art, two or more simultaneously operable LCC's have often been juxtaposed adjacent to each other at a high packaging density in certain areas of the printed circuit substrate. This results in uneven temperature distribution over the substrate due to the heat build up. This increase in temperature of a particular area of the substrate reduces the performance and product life of IC chips in the chip carriers mounted on that area.

SUMMARY OF THE INVENTION

The object of the present invention is to eliminate the foregoing drawbacks and to provide a modular semiconductor device wherein IC chips can be mounted on a printed circuit substrate at a high packaging density without sacrifice to the performance and life of the IC chips.

According to the invention, the IC chips are grouped into at least two groups which are selectively operated. The IC chips in one group are arranged alternately with the IC chips in the other group in such a manner that a substantially uniform temperature distribution, due to heat buildup in the substrate during operation of the chips, is provided over the printed circuit substrate.

With this arrangement, localized heating of the printed circuit substrate is avoided and it is possible to maintain the temperature of all the IC chips within permissible limits.

In one embodiment of the invention, the IC chips in one group are connected to a common select signal terminal of the printed circuit substrate while the IC chips in the other group are connected to another common select signal terminal of the substrate. "Pairs" of IC chips from the two groups are connected to common output terminals of the substrate for selective operation.

The modular semiconductor device according to the invention may be in the form of a single-sided module wherein the IC chips are mounted on one side of the printed circuit substrate.

Alternatively, the modular semiconductor device may be of the double-sided type wherein the IC chips are mounted on both sides of the printed circuit substrate. In this instance, the IC chips may be arranged in a staggered relationship with respect to the substrate.

Each group of IC chips may be further subdivided into subgroups and the subgroups may be alternately mounted on the printed circuit substrate.

DESCRIPTION OF THE PREFERRED EMBODIMENTS

Figure 1:
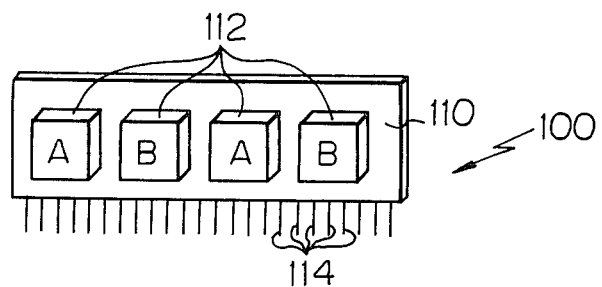
FIG. 1 is a perspective view of the modular semiconductor device according to one embodiment of the invention.

Referring to FIG. 1, there is shown a single-sided 24-pin modular semiconductor device 100. The module 100 includes a multilayer printed circuit substrate 110 made for example, from ceramic material, and four LCC's 112 mounted thereon. Each LCC 112 receives therein an IC chip (not shown) serving as a memory IC for an electronic system. These LCC's 112 are grouped into two groups represented by the symbols A and B. The group A LCC's are arranged alternately with the group B LCC's. Each LCC 112, as with LCC's in general, is not provided with outer leads or input/output pins but, instead, is electrically connected to the substrate 110 through printed circuits provided on the substrate 110. The multilayer printed circuit substrate 110 is provided with outer leads 114, numbering 24 in the illustrated example, for electrically connecting the IC chips in the LCC's to the outside of the device.

Figure 2:
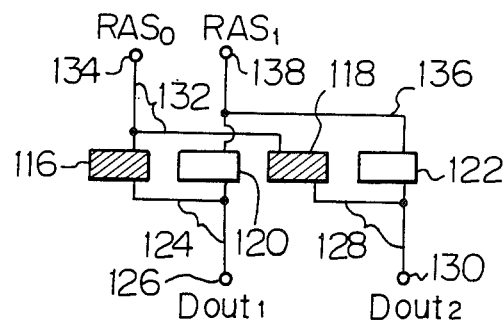
FIG. 2 is a wiring diagram of the embodiment of FIG. 1.

Referring to FIG. 2, the IC chips for the group A LCC's 112 are shown by the hatched boxes 116 and 118, and the IC chips for the group B LCC's 112 are shown by the blank boxes 120 and 122. The output pad of the IC chip 116 in group A and the IC chip in group B are connected by an interconnecting lead 124 to a common first data-output terminal ($D_{out1}$) 126 to which an outer lead 114 (FIG. 1) is soldered and which serves as a first data-output pin. Similarly, the output pad of the IC chip 118 in group A and the IC chip 122 in group B are connected through an interconnecting lead 128 to a second common data-output terminal ($D_{out2}$) 130 to which is soldered another outer lead 114 which serves as a second data-output pin.

Row address strobe signal (RAS) pads of IC chips 116 and 118 in group A are connected in common by a lead 132 to a first row address strobe signal terminal (RAS$_0$) 134. Similarly, the row address strobe signal (RAS) pads of IC chips 120 and 122 in group B are connected by a lead 136 to a second row address strobe signal terminal (RAS$_1$) 138. An outer lead 114 is soldered to each of these RAS terminals 134 and 138. Leads and terminals connecting the remaining pads of the IC chips 116, 118, 120 and 122 to the remaining outer leads 114 are omitted from the drawing for the purpose of simplicity.

In operation, a high level voltage is applied from an outside controller or driver (not shown) on either the first or second RAS terminals 134 or 138 to selectively activate either group A or B of the IC chips. Thus, at a given time t$_1$, only the IC chips 116 and 118 of group A are activated while the IC chips 120 and 122 of group B are deactivated, or vice versa. Due to the alternate arrangement and selective activation of IC chips of different groups, the printed circuit substrate as a whole does not undergo any substantial localized heating so that no appreciable temperature gradient is present over the substrate. Thus, it is possible to increase the packaging density of the module while ensuring a substantially uniform temperature distribution.

In the case where, for example, 64 Kbit IC chips are used to form a random access memory (RAM) module, IC chips in group A and associated IC chips in group B cooperate with each other to form two pairs of 128 Kbit memories having respective data-outputs 126 and 130. In each pair, either one of the two IC chips is operated at one time and issues a data-output signal through a common data-output outer lead. Thus, in the module according to the invention, it is possible to reduce the number of outer leads. This enables the reduction in size of the printed circuit substrate which, in turn, contributes to a more compact module.

Figure 3:
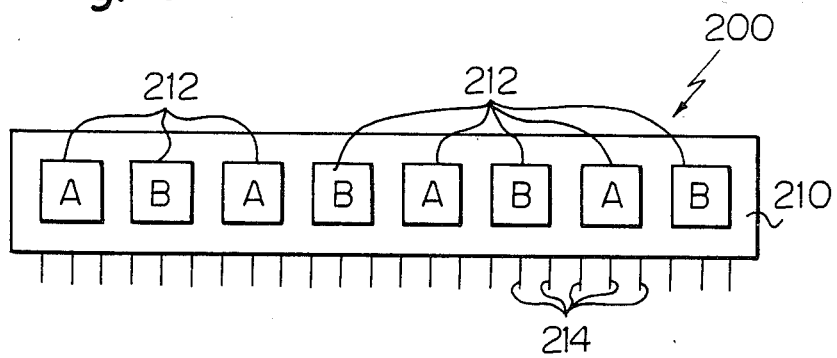
FIG. 3 is an elevated front view of the modular semiconductor device according to another embodiment of the invention.
Figure 4:
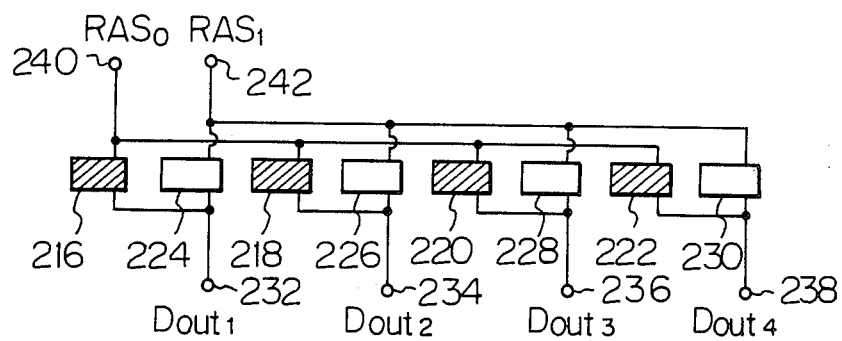
FIG. 4 is a wiring diagram of the embodiment of FIG. 3.

The embodiment in FIGS. 3 and 4 differs from that shown in FIGS. 1 and 2 only in that the number of IC chips is multiplied. There is shown a single-sided 24-pin modular semiconductor device 200 having eight 64 Kbit LCC's 212 mounted on a ceramic printed circuit substrate 210 at one side thereof. The LCC's 212 are grouped into two groups A and B as in the first embodiment shown in FIG. 1, with each group comprising four chip carriers. As shown in FIG. 4, the data-output pad of each of 64 Kbit IC chips 216, 218, 220, and 222 in group A is connected with the data-output pad of associated 64 Kbit IC chips 224, 226, 228, and 230 in group B, respectively, to form 128 Kbit pairs having data-output terminals (D$_{out1}$, D$_{out2}$, D$_{out3}$ or D$_{out4}$) 232, 234, 236, and 238. The RAS pads of the group A IC chips are connected to a first RAS terminal (RAS$_0$) 240, and the RAS pads of the group B IC chips are connected to a second RAS terminal (RAS$_1$) 242. The function and advantage of the module 200 are in principle the same as that of the module 100 of FIGS. 1 and 2.

Figure 5:
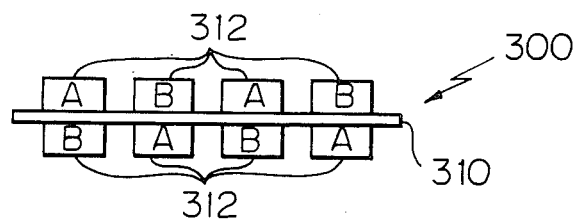
FIG. 5 is a top plan view of the modular semiconductor device of a further embodiment of the invention.
Figure 6:
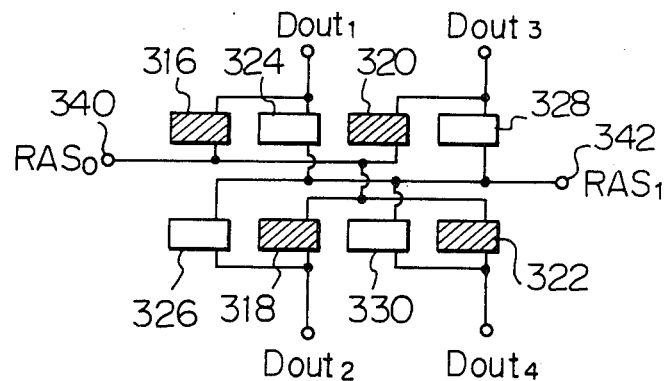
FIG. 6 is a wiring diagram of the embodiment of FIG. 5.

FIGS. 5 and 6 are circuit diagrams of a double-sided 4-data-output 24-pin modular semiconductor device 300 provided with eight 64 Kbit LCC's 312 grouped into groups A and B and mounted on both sides of a printed circuit substrate 310. In each group LCC's are arranged in a staggered relationship with respect to the substrate 310, the LCC's in one group being alternately arranged with those in the other group. As shown in FIG. 6, the data-output pad of each of the 64 Kbit IC chips 316, 318, 320, and 322 in group A is connected with the data-output pad of an associated 64 Kbit IC chip 324, 326, 328 and 330 in group B to form 128 Kbit pairs having data-output terminals (D$_{out1}$, D$_{out2}$, D$_{out3}$ or D$_{out4}$) 322, 324, 326 and 338. The RAS pads of the IC chips in group A are connected to a first RAS terminal (RAS$_0$) 340, and the RAS pads of the IC chips in group B are connected to a second RAS terminal (RAS$_1$) 342. The operation and advantage of this embodiment are substantially the same as those of the preceding embodiments.

Figure 7:
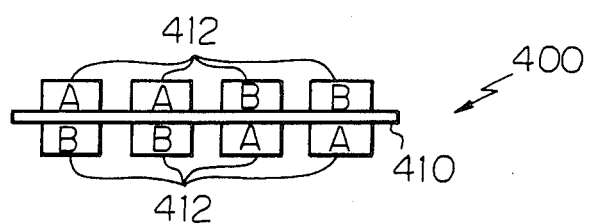
FIG. 7 is a top plan view of the modular semiconductor device according to another embodiment of the invention.
Figure 8:
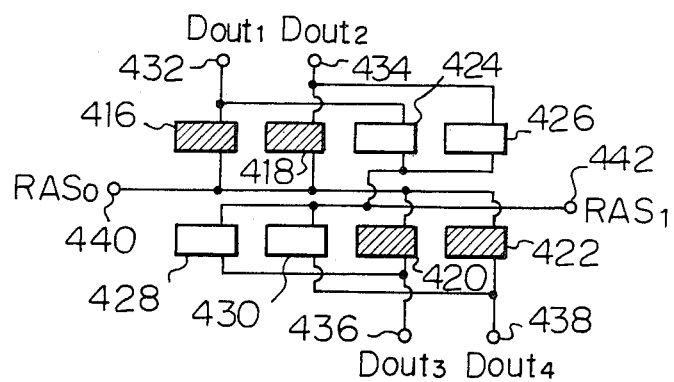
FIG. 8 is a wiring diagram of the embodiment of FIG. 7.

FIGS. 7 and 8 are circuit diagrams of a double-sided 4-data-output 24-pin modular semiconductor device 400 similar to the module 300 shown in FIGS. 5 and 6 and comprises eight 64 Kbit LCC's 412 mounted on a ceramic printed circuit substrate 410 on both sides thereof. In this embodiment, however, each group A and B of the LCC's is divided into two subgroups alternately arranged in a staggered relationship as shown in FIG. 7. As shown in FIG. 8, the IC chips 416, 418, 420, and 422 in group A are connected to a first RAS terminal (RAS$_0$) 440 while the IC chips 424, 426, 428, and 430 in group B are connected to a second RA terminal (RAS$_1$) 442 to selectively activate either group of IC chips. The IC chips 416 and 424 are connected to a first data-output terminal (D$_{out1}$) 432, the chips 418 and 426 to a second data-output terminal (D$_{out2}$) 434, the chips 420 and 428 to a third data-output terminal (D$_{out3}$) 436, and the chips 422 and 430 to a fourth data-output terminal (D$_{out4}$) 438. In operation, when the group A IC chips are selected, the subgroup comprising chips 416 and 418 will heat the area of the substrate on one side thereof, while the other subgroup comprising chips 420 and 422 will heat the other area of the substrate on the opposite side. This prevents localized heating of the substrate to a certain extent, though not as effectively as in the preceding embodiments.

We claim:

1. A modular semiconductor device including a printed circuit having first and second sides, comprising:

IC chips mounted on the first side of the printed circuit substrate and grouped into at least two groups which are selectively operated, said IC chips in said at least two groups being connected together in pairs, a first group of said at least two groups of IC chips being arrayed alternately with a second group of said at least two groups of IC chips, for providing a substantially uniform temperature distribution over the printed circuit substrate of heat built-up in the printed circuit substrate due to the operation of said IC chips;

first and second common select signal terminals, respectively, operatively connected to said at least two groups, for selectively activating one of said at least two groups of said IC chips, said first common select signal terminal receiving a first select signal to activate said IC chips of said first group of said at least two groups, said second common select signal terminal receiving a second select signal to activate said IC chips of said second group of said at least two groups while said IC chips of said first group of said at least two groups are deactivated; and common data output terminals, respectively, operatively connected to said pairs of said IC chips of said at least two groups, for selectively outputting data.

2. A modular semiconductor device including a printed circuit substrate having first and second sides, comprising:

IC chips mounted on the first and second sides of the printed circuit substrate and grouped into at least two groups which are selectively operated, said IC chips of said at least two groups being arrayed alternately on the first side of the printed circuit substrate and in a staggered relationship with respect to said at least two groups of IC chips arrayed alternately directly in line with said IC chips on the second side of the printed circuit substrate, so as to provide a substantially uniform temperature distribution, over the printed circuit substrate, of heat built-up in the printed circuit substrate due to the operation of said IC chips, said IC chips in said at least two groups being connected together in pairs;

at least two common select signal terminals, respectively, operatively connected to said at least two groups, for selectively activating one of said at least two groups; and common data output terminals, respectively, operatively connected to the pairs of said IC chips of said at least two groups, for selectively outputting data.

3. A modular semiconductor device including a printed circuit substrate having first and second sides, comprising:

IC chips mounted on the first and second sides of the printed circuit substrate and grouped into at least two groups, including first and second groups, which are selectively operated, said first group of said IC chips being arranged alternately with said second group of IC chips, said at least two groups being subdivided into subgroups arranged alternately directly in line with each other with respect to the first and second sides of the printed circuit substrate, for providing a substantially uniform temperature distribution over the printed circuit substrate of heat built-up in the printed circuit substrate due to the operation of said IC chips, said IC chips in said at least two groups being connected together in pairs;

at least two common select signal terminals, respectively, operatively connected to said at least two groups, for selectively activating at least said first group of IC chips; and common data output terminals, respectively, operatively connected to the pairs of said IC chips of said at least two groups, for selectively outputting data.

4. A modular semiconductor device including a printed circuit substrate having first and second sides and common select signal terminals and common data output terminals, comprising a plurality of IC chips mounted on the first and second sides of the printed circuit substrate, said IC chips being grouped into at least two groups, including first and second groups, which are arranged in a staggered relationship with respect to the printed circuit substrate and which are selectively operated, said IC chips in said first group being operatively connected to one of said common select signal terminals of the printed circuit substrate while the IC chips in said second group being operatively connected to another one of said common select signal terminals of the printed circuit substrate, pairs of said IC chips from said at least two groups being respectively connected to said common data output terminals of the printed circuit substrate to provide a selective operation, said IC chips of said first group being arranged alternately with said IC chips of said second group for providing a substantially uniform temperature distribution over the printed circuit substrate of heat built up in the printed circuit substrate due to the operation of said IC chips.

5. A modular semiconductor device including a printed circuit substrate having first and second sides and common select signal terminals and common data output terminals, comprising a plurality of IC chips mounted on the first and second sides of the printed circuit substrate, said IC chips being grouped into at least two groups, including first and second groups, which are selectively operated, said at least two groups of said IC chips being subdivided into subgroups arranged alternately on the printed circuit substrate, at least said first group being operatively connected to one of said common select signal terminals of the printed circuit substrate, said second group being operatively connected to another one of said common select signal terminals of the printed circuit substrate, pairs of said IC chips from said at least two groups being respectively connected to said common data output terminals of the printed circuit substrate to provide a selective operation, said IC chips of at least said first group being arranged alternately with said IC chips of at least said second group for providing a substantially uniform temperature distribution over the printed circuit substrate of heat built-up in the printed circuit substrate due to the operation of said IC chips.

* * * * *

UNITED STATES PATENT AND TRADEMARK OFFICE
CERTIFICATE OF CORRECTION

PATENT NO.   :   4,689,658
DATED        :   AUGUST 25, 1987
INVENTOR(S)  :   HIDEHIKO AKASAKI ET AL.

It is certified that error appears in the above-identified patent and that said Letters Patent is hereby corrected as shown below:

Col. 4, line 6, "338" should be --328--;

line 23, "RA" should be --RAS--.

Signed and Sealed this

Twelfth Day of January, 1988

Attest:

DONALD J. QUIGG

*Attesting Officer*      *Commissioner of Patents and Trademarks*